United States Patent
Weber et al.

(10) Patent No.: US 9,383,145 B2
(45) Date of Patent: Jul. 5, 2016

(54) SYSTEM AND METHOD OF BOILING HEAT TRANSFER USING SELF-INDUCED COOLANT TRANSPORT AND IMPINGEMENTS

(75) Inventors: Richard M. Weber, Prosper, TX (US); Kerrin A. Rummel, Richardson, TX (US); Albert P. Payton, Sachse, TX (US)

(73) Assignee: Raytheon Company, Waltham, MA (US)

( * ) Notice: Subject to any disclaimer, the term of this patent is extended or adjusted under 35 U.S.C. 154(b) by 1385 days.

(21) Appl. No.: 12/208,641

(22) Filed: Sep. 11, 2008

(65) Prior Publication Data

US 2009/0020266 A1    Jan. 22, 2009

Related U.S. Application Data

(60) Division of application No. 11/465,372, filed on Aug. 17, 2006, now abandoned, and a continuation-in-part of application No. 11/290,065, filed on Nov. 30, 2005, now abandoned.

(51) Int. Cl.
*H01L 23/467* (2006.01)
*F28D 15/02* (2006.01)
(Continued)

(52) U.S. Cl.
CPC ............ *F28D 15/0266* (2013.01); *F28F 3/022* (2013.01); *H01L 23/3677* (2013.01);
(Continued)

(58) Field of Classification Search
CPC ................... F28D 2021/0029; F28D 15/0266; F28F 3/022; F28F 3/12; H01L 23/4735; H01L 23/3677; H01L 23/427

USPC ............................................. 165/80.4, 109.1
See application file for complete search history.

(56) References Cited

U.S. PATENT DOCUMENTS 1,528,619 A    3/1925  Alphonse
1,906,422 A    5/1933  Roulton
(Continued)

FOREIGN PATENT DOCUMENTS

DE    20 46 750 A1    4/1971
DE    103 33 877    2/2005
(Continued)

OTHER PUBLICATIONS

Margaret Ingels, (pp. 59 and 80 of Willis Haviland Carrier "*Father of Air Conditioning*", Country Life Press—Garden City (1952).
(Continued)

*Primary Examiner* — Judy Swann
*Assistant Examiner* — Matthew L Brimmer (57) ABSTRACT

According to one embodiment of the invention, a cooling system for a heat-generating structure comprises a chamber and structure disposed within the chamber. The chamber has an inlet and an outlet. The inlet receives fluid coolant into the chamber substantially in the form of a liquid. The outlet dispenses the fluid coolant out of the chamber at least partially in the form of a vapor. The structure disposed within the chamber receive thermal energy from the heat generating structure and transfers at least a portion of the thermal energy to the fluid coolant. The thermal energy from the heat-generating structure causes at least a portion of the fluid coolant substantially in the form of a liquid to boil and effuse vapor upon contact with a portion of the structure. The effusion of vapor creates a self-induced flow in the chamber. The self-induced flow distributes non-vaporized fluid coolant substantially in the form of a liquid to other portions of the structure.

19 Claims, 9 Drawing Sheets

(51) Int. Cl.
*F28F 3/02* (2006.01)
*H01L 23/367* (2006.01)
*H01L 23/427* (2006.01)
*H01L 23/473* (2006.01)
*F28F 3/12* (2006.01)

(52) U.S. Cl.
CPC .......... *H01L23/427* (2013.01); *H01L 23/4735* (2013.01); *F28F 3/12* (2013.01); *H01L 2924/0002* (2013.01)

(56) References Cited

U.S. PATENT DOCUMENTS

| | | | |
|---|---|---|---|
| 2,321,964 A | 6/1943 | Zieber | |
| 2,371,443 A | 3/1945 | Harold | |
| 2,991,978 A | 7/1961 | Jones | |
| 3,131,548 A | 5/1964 | Chubb et al. | |
| 3,174,540 A | 3/1965 | Dutton | |
| 3,371,298 A | 2/1968 | Narbut | |
| 3,524,497 A | 8/1970 | Chu et al. | |
| 3,586,101 A | 6/1971 | Chu | |
| 3,609,991 A | 10/1971 | Chu et al. | |
| 3,756,903 A | 9/1973 | Jones | |
| 3,774,677 A | 11/1973 | Antonetti et al. | |
| 3,989,102 A | 11/1976 | Jaster et al. | |
| 4,003,213 A | 1/1977 | Cox | |
| 4,019,098 A | 4/1977 | McCready et al. | |
| 4,129,180 A | 12/1978 | Larinoff | |
| 4,169,356 A | 10/1979 | Kingham | |
| 4,295,341 A | 10/1981 | Gale | |
| 4,296,455 A | 10/1981 | Leaycraft et al. | |
| 4,301,861 A | 11/1981 | Larinoff | |
| 4,330,033 A | 5/1982 | Okada et al. | |
| 4,381,817 A | 5/1983 | Brigida et al. | |
| 4,411,756 A | 10/1983 | Bennett et al. | |
| 4,495,988 A | 1/1985 | Grossman | |
| 4,511,376 A | 4/1985 | Coury | |
| 4,585,054 A | 4/1986 | Köprunner | |
| 4,638,642 A | 1/1987 | Tokuno | |
| 4,733,293 A | 3/1988 | Gabuzda ................... | 357/81 |
| 4,794,984 A | 1/1989 | Lin | |
| 4,851,856 A | 7/1989 | Altoz | |
| 4,938,280 A | 7/1990 | Clark | |
| 4,945,980 A | 8/1990 | Umezawa | |
| 4,998,181 A | 3/1991 | Haws et al. | |
| 5,019,880 A | 5/1991 | Higgins, III ................. | 357/81 |
| 5,021,924 A | 6/1991 | Kieda et al. | |
| 5,067,560 A | 11/1991 | Carey et al. | |
| 5,086,829 A | 2/1992 | Asakawa | |
| 5,128,689 A | 7/1992 | Wong et al. | |
| 5,148,859 A | 9/1992 | Beamer | |
| 5,158,136 A | 10/1992 | Azar | |
| 5,161,610 A | 11/1992 | Leidinger | |
| 5,168,919 A | 12/1992 | Berenholz et al. | |
| 5,181,395 A | 1/1993 | Carpenter et al. | |
| 5,183,104 A | 2/1993 | Novotny | |
| 5,198,889 A | 3/1993 | Hisano et al. | |
| 5,239,443 A | 8/1993 | Fahey et al. | |
| 5,245,839 A | 9/1993 | Chang et al. | |
| 5,261,246 A | 11/1993 | Blackmon et al. | |
| 5,333,677 A | 8/1994 | Molivadas | |
| 5,353,865 A | 10/1994 | Adiutori et al. | |
| 5,447,189 A | 9/1995 | Mcintyre | |
| 5,464,325 A | 11/1995 | Albring et al. | |
| 5,493,305 A | 2/1996 | Wooldridge et al. | |
| 5,497,631 A | 3/1996 | Lorentzen et al. | |
| 5,501,082 A | 3/1996 | Tachibana et al. | |
| 5,515,690 A | 5/1996 | Blackmon et al. | |
| 5,522,452 A * | 6/1996 | Mizuno et al. ............... | 165/80.4 |
| 5,605,054 A | 2/1997 | Chen | |
| 5,655,600 A | 8/1997 | Dewar et al. | |
| 5,666,269 A | 9/1997 | Romero et al. | |
| 5,701,751 A | 12/1997 | Flores | |
| 5,761,037 A | 6/1998 | Anderson et al. | |
| 5,815,370 A | 9/1998 | Sutton | |
| 5,818,692 A | 10/1998 | Denney, Jr. et al. | |
| 5,829,514 A | 11/1998 | Smith et al. | |
| 5,841,564 A | 11/1998 | McDunn et al. | |
| 5,862,675 A | 1/1999 | Scaringe et al. | |
| 5,871,043 A | 2/1999 | Osakabe et al. | |
| 5,910,160 A | 6/1999 | Caakmakci et al. | |
| 5,943,211 A | 8/1999 | Havey et al. | |
| 5,950,717 A | 9/1999 | Fay | |
| 5,960,861 A | 10/1999 | Price et al. | |
| 6,018,192 A | 1/2000 | Root et al. | |
| 6,052,284 A | 4/2000 | Suga et al. | |
| 6,055,154 A | 4/2000 | Azar | |
| 6,173,758 B1 | 1/2001 | Ward et al. | |
| 6,292,364 B1 | 9/2001 | Fitzgerald et al. | |
| 6,297,775 B1 | 10/2001 | Haws et al. | |
| 6,305,463 B1 | 10/2001 | Salmonson | |
| 6,341,645 B1 | 1/2002 | Tanaka | |
| 6,347,531 B1 | 2/2002 | Roberts et al. | |
| 6,349,760 B1 | 2/2002 | Budelman | |
| 6,366,462 B1 | 4/2002 | Chu et al. | |
| 6,397,932 B1 | 6/2002 | Calaman et al. | |
| 6,415,619 B1 | 7/2002 | Bash | |
| 6,498,725 B2 | 12/2002 | Cole et al. | |
| 6,519,148 B2 | 2/2003 | Nakagawa et al. ........... | 361/687 |
| 6,519,955 B2 | 2/2003 | Marsala | |
| 6,529,377 B1 | 3/2003 | Somadder et al. | |
| 6,536,516 B2 | 3/2003 | Davies et al. | |
| 6,594,479 B2 | 7/2003 | Ammar et al. | |
| 6,603,662 B1 | 8/2003 | Ganrot | |
| 6,679,081 B2 | 1/2004 | Marsala | |
| 6,708,511 B2 | 3/2004 | Martin | |
| 6,729,383 B1 | 5/2004 | Cannell et al. | |
| 6,827,135 B1 | 12/2004 | Kramer et al. | |
| 6,952,345 B2 | 10/2005 | Weber et al. | |
| 6,952,346 B2 | 10/2005 | Tilton et al. | |
| 6,957,550 B2 | 10/2005 | Wyatt et al. | |
| 6,976,527 B2 | 12/2005 | Kirshberg et al. | |
| 7,000,691 B1 | 2/2006 | Weber | |
| 7,254,957 B2 | 8/2007 | Weber et al. ................. | 62/259.2 |
| 2003/0053298 A1 | 3/2003 | Yamada et al. | |
| 2003/0062149 A1 | 4/2003 | Goodson et al. | |
| 2003/0178178 A1* | 9/2003 | Breuer et al. ................ | 165/80.2 |
| 2003/0188858 A1 | 10/2003 | Miyazaki | |
| 2003/0205363 A1 | 11/2003 | Chu et al. | |
| 2004/0231351 A1 | 11/2004 | Wyatt | |
| 2006/0021736 A1 | 2/2006 | Tran | |
| 2007/0119568 A1 | 5/2007 | Weber et al. ................. | 165/80.4 |
| 2007/0119572 A1 | 5/2007 | Weber et al. ................. | 165/80.4 |

FOREIGN PATENT DOCUMENTS

| | | |
|---|---|---|
| EP | 0 243 239 A2 | 4/1987 |
| EP | 02 51 836 A1 | 5/1987 |
| EP | 0 817 263 A2 | 10/1991 |
| EP | 0 666 214 A1 | 8/1995 |
| EP | 1 081 759 A2 | 3/2001 |
| EP | 1 143 778 A1 | 10/2001 |
| EP | 1380 799 A2 | 5/2003 |
| EP | 1 381 083 A2 | 1/2004 |
| EP | 1 448 040 A | 8/2004 |
| EP | 1 519 646 A2 | 3/2005 |
| EP | 1 601 043 A | 11/2005 |
| FR | 2 730 556 A1 | 2/1995 |
| GB | 1220952 | 3/1968 |
| JP | 60 039853 A | 3/1985 |
| JP | 60136349 | 7/1985 |
| JP | 60136349 A * | 7/1985 |
| JP | 04 147657 | 5/1992 |
| JP | 4-316972 | 9/1992 |
| WO | WO 00/65890 | 2/2000 |
| WO | WO 02/23966 | 3/2002 |
| WO | WO 02/42703 A2 | 5/2002 |
| WO | WO 2006/072244 | 7/2006 |

OTHER PUBLICATIONS

Dirk Van Orshoven, "*The use of water as a refrigerant—an exploratory investigation*", Thesis University Wisconsin, 1991, pp. I, III-XIII, 1-114.

(56) References Cited

OTHER PUBLICATIONS

"An Integrated Thermal Architecture for Thermal Management of High Power Electronics", High Power Electronics, http:www.coolingzone.com/Guest/News/NL_JAN_2003/Thermacore/ Thermacore Jan. 2003, 22 pages.
Beaty, et al., "New Guidelines for Data Center Cooling", Dec. 2003; 8 pages.
Wilson, et al., "A Thermal Bus System for Cooling Electronic Components in High-Density Cabinets", 2004 AHSRAE Transactions; Symposia, pp. 567-573.
Center for the Analysis and Dissemination of Demonstrated Energy Technology (CADDET), Cooling plant at LEGO uses water as refrigerant, Sep. 1997.
Muller, Norbert, Ph.D. Turbo Chillers using Water as a Refrigerant, Michigan State University, AMSE Process Industry Division PID Newsletter, Fall 2002, p. 3.
Maab, Jurgen and Feddeck, Paul, BINE Projectinfo, BINE Informationsdienst, Wasser als Kaltemittel, Aug. 2003.
Kharzi, A., Ph.D., Preliminary Study of a Novel R718 Turbo-Compression Cycle using a 3-port condensing wave rotor, 2004 International ASME Turbo Exposition, ASME Paper GT2004-53622, Austria, Jun. 2004.
"Subcooled Flow Boiling With Flow Pattern Control" IBM Technical Disclosure Bulletin, vol. 22, Issue 5, pp. 1843-1844 Oct. 1, 1979.
U.S. Appl. No. 10/193,571, filed Jul. 11, 2002, entitled "Method and Apparatus for Removing Heat from a Circuit", 33 pages of text and 3 pages of drawings.
U.S. Appl. No. 10/192,891, filed Jul. 11, 2002 by inventor Richard M. Weber for "Method and Apparatus for Cooling with Coolant at a Subambient Pressure", 21 pages of text and 2 pages of drawings.
U.S. Appl. No. 10/440,716, filed May 19, 2003 by inventors William Gerald Wyatt and Richard M. Weber for "Method and Apparatus for Extracting Non-Condensable Gases in a Cooling System", 21 pages of text and 1 drawing sheet.
U.S. Appl. No. 10/853,038, filed May 25, 2004 by inventors Richard M. Weber, et al. for "Method and Apparatus for Controlling Cooling with Coolant at a Subambient Pressure" 25 pages of text and 4 drawing sheets.
U.S. Appl. No. 11/058,691, filed Feb. 15, 2005 by inventors Weber, et al., "Method and Apparatus for Cooling with Coolant at a Subambient Pressure", 28 pages.
PCT Notification of Transmittal of the International Search Report or the Declaration dated Sep. 27, 2004 for PCT/US2004/015086.
EPO Search Report dated Oct. 25, 2004 for U.S. Pat. No. 03254283.9-2203; Reference No. JL3846.
EPO Search Report dated Nov. 3, 2004 for U.S. Pat. No. 03254285.4-2301; Reference No. JL3847.
EP Search Report dated May 4, 2005 for European Patent Application No. EP 04256509.3.
EP Search Report dated Mar. 4, 2005 for European Patent Application No. EP 04256509.3-2220.
Notification of Transmittal of the International Search Report and the Written Opinion of the International Searching Authority or the Declaration Int'l Application No. PCT/US2005/1020544; date of mailing: Oct. 10, 2005; Int'l filing date Jun. 10, 2005; 3 pages.
"International Search Report", Int'l Application No. PCT/US2005/020544; Earliest Priority Date: Jun. 14, 2004; Int'l filing date: Jun. 10, 2005; 5 pages.
"Written Opinion of the International Searching Authority," Int'l Application No. PCT/US2005/020544; Earliest Priority Date: Jun. 14, 2004; Int'l filing date: Jun. 10, 2005; International Patent Classification:F25B43/04; 9 pages.
Notification of Transmittal of the International Search Report and The Written Opinion of the International Searching Authority, or the Declaration; PCT/US2007/004146; dated Jul. 31, 2007; 6 pages.
European Search Report for International Application No. PCT/US2007/008842; 9 pages, Oct. 5, 2007.
Application Bulletin #16; "Water Purity Requirements in Liquid Cooling Systems;" Jun. 12, 1995; 4 pages.
European Patent Office Communication, dated Mar. 20, 2008, Reference JL36895P.EPP, 6 pages.
Kilicarslan, et al., "A comparative study of water as a refrigerant with some current refrigerants", International Journal of Energy Research, pp. 948-959, 2005.
Akbari, et al., "Utilizing Wave Rotor Technology to Enhance the Turbo Compression in Power and Refrigeration Cycles", Proceedings of IMECE'03, 2003 ASME International Mechanical Engineering, Nov. 16-21, 2003.
Kharazi, et al., "Implementation of 3-Port Condensing Wave Rotors in R718 Cycles", Journal of Energy Resources Technology, Dec. 2006, vol. 128, pp. 325-334.
Karazi, et al. "An Application of Wave Rotor Technology for Performance Enhancement of R718 Refrigeration Cycles", The American Institute of Aeronautics and Astronautics, Inc., pp. 965-977.
Kharazi, et al., "Performance Benefits of R718 Turbo-Compression Cycle Using 3-Port Condensing Wave Rotors", Proceedings of IMECE04; 2004 ASME International Mechanical Engineering Congress and Exposition, Nov. 13-20, 2004, pp. 167-176.
Kharazi, et al., "Preliminary Study of a Novel R718 Turbo-Compression Cycle Using a 3-Port Condensing Wave Rotor", Proceedings of ASME Turbo Expo. 2004, Jun. 14-17, 2004.
Kharazi, et al., "Preliminary Study of a Novel R718 Compression Refrigeration Cycle Using a Three-Port Condensing Wave Rotor", Journal of Engineering for Gas Turbines and Power, Jul. 2005, vol. 127, pp. 539-544.
Akbari, et al., "A Review of Wave Rotor Technology and Its Applications", Proceedings of IMEC04, 2004 ASME International Mechanical Engineering Congress and Exposition, Nov. 13-20, 2004, IMECE2004-60082, pp. 81-103.
European Search Report and Communication, 06256124.6-1235 / 1793422, 8 pages, dated Apr. 22, 2010.
European Patent Office Communication, dated Nov. 26, 2008, JL40551P.EPP, 7 pages.
USPTO; Office Action, U.S. Appl. No. 11/290,065, filed Nov. 30, 2005, in the name of Richard M. Weber, (5 pg), Notification Date Jun. 15, 2007.
USPTO; Office Action, U.S. Appl. No. 11/290,065, filed Nov. 30, 2005, in the name of Richard M. Weber, (16 pg), Notification Date Sep. 18, 2007.
USPTO; Final Office Action, U.S. Appl. No. 11/290,065, filed Nov. 30, 2005, in the name of Richard M. Weber, (8 pg), Notification Date Mar. 10, 2008.
USPTO; Notice of Abandonment, U.S. Appl. No. 11/290,065, filed Nov. 30, 2005, in the name of Richard M. Weber, (3 pg), Notification Date Oct. 8, 2008.
USPTO; Office Action, U.S. Appl. No. 11/465,372, filed Aug. 17, 2006, in the name of Richard M. Weber; (8 pg), Notification Date Sep. 18, 2007.
USPTO; Office Action, U.S. Appl. No. 11/465,372, filed Aug. 17, 2006, in the name of Richard M. Weber; (5 pg), Notification Date Jun. 15, 2007.
USPTO;Final Office Action, U.S. Appl. No. 11/465,372, filed Aug. 17, 2006, in the name of Richard M. Weber; (9 pg), Notification Date Mar. 10, 2008.
USPTO; Notice of Abandonment, U.S. Appl. No. 11/465,372, filed Aug. 17, 2006, in the name of Richard M. Weber; (2pg), Notification Date Jan. 28, 2009.
USPTO; Office Action, U.S. Appl. No. 11/420,184, filed May 24, 2006, in the name of Kerrin A. Rummel, Weber; (5 pg), Notification Date Jun. 15, 2007.
USPTO; Office Action, U.S. Appl. No. 11/420,184, filed May 24, 2006, in the name of Kerrin A. Rummel; (9 pg), Notification Date Dec. 14, 2007.
USPTO; Final Office Action, U.S. Appl. No. 11/420,184, filed May 24, 2006, in the name of of Kerrin A. Rummel; (8 pg), Notification Date Jul. 14, 2008.
USPTO; Office Action, U.S. Appl. No. 11/420,184, filed May 24, 2006, in the name of of Kerrin A. Rummel; (5 pg), Notification Date Jan. 12, 2009.
USPTO; Office Action, U.S. Appl. No. 11/420,184, filed May 24, 2006, in the name of of Kerrin A. Rummel; (10 pg), Notification Date Mar. 11, 2009.

(56) References Cited

OTHER PUBLICATIONS

USPTO; Notice of Abandonment, U.S. Appl. No. 11/420,184, filed May 24, 2006, in the name of of Kerrin A. Rummel; (2 pg), Notification Date Sep. 23, 2009.
European Patent Office Communication pursuant to Article 94(3) EPC; Application No. 07 253 191.6-2301, Ref. JL 40551P.EPP, (5 pgs), Date mailed: Jan. 14, 2011.
European Patent Office Communication, Munich Germany office action Re: Communication pursuant to Article 94(3) EPC, for Application No. 07 253 191.6-2301, Ref. JL40551P.EPP, (5 pgs), Aug. 18, 2011.
Response to Notice to File Corrected Application Paper; U.S. Appl. No. 11/290,065, filed Nov. 30, 2005; in the name of Richard M. Weber, et al.; (3 pgs), mailed Feb. 28, 2006.
Response to Examiner's Election/Restriction Requirement re: OA mailed Jun. 15, 2007; U.S. Appl. No. 11/290,065, filed Nov. 30, 2005, in the name of Richard M. Weber, et al.; (2 pgs), filed Jul. 16, 2007.
Response to Non-Final Office Action re: OA mailed Sep. 18, 2007; U.S. Appl. No. 11/290,065, filed Nov. 30, 2005, in the name of Richard M. Weber, et al.; (11 pgs), filed Dec. 18, 2007.
Response to Examiner's Election/Restriction Requirement re: OA mailed Jun. 15, 2007; U.S. Appl. No. 11/465,372, filed Aug. 17, 2006, in the name of Richard M. Weber, et al.; (2 pgs), filed Jul. 16, 2007.
Response to Non-Final Office Action re: OA mailed Sep. 18, 2007; U.S. Appl. No. 11/465,372, filed Aug. 17, 2006, in the name of Richard M. Weber, et al.; (12 pgs), filed Dec. 18, 2007.
Notice of Appeal, Pre-Appeal Brief Request for Review re: OA mailed Mar. 10, 2008; U.S. Appl. No. 11/465,372, filed Aug. 17, 2006, in the name of Richard M. Weber, et al.; (6 pgs), filed Jun. 10, 2008.
Response to Examiner's Election/Restriction Requirement re: OA mailed Jun. 15, 2007; U.S. Appl. No. 11/420,184, filed May 24, 2006, in the name of Kerrin A. Rummel; (4 pgs), filed Aug. 13, 2007.
Response to Non-Responsive Reply re: OA mailed Aug. 24, 2007; U.S. Appl. No. 11/420,184, filed May 24, 2006, in the name of Kerrin A. Rummel; (2 pgs), filed Sep. 24, 2007.
Response to Non-Final Office Action re: OA mailed Dec. 14, 2007; U.S. Appl. No. 11/420,184, filed May 24, 2006, in the name of Kerrin A. Rummel; (13 pgs), filed Mar. 14, 2008.
Response to Final Office Action re: OA mailed Jul. 14, 2008; U.S. Appl. No. 11/420,184, filed May 24, 2006, in the name of Kerrin A. Rummel; (8 pgs), filed Sep. 9, 2008.
Request for Continued Examination (RCE) Transmittal; U.S. Appl. No. 11/420,184, filed May 24, 2006, in the name of Kerrin A. Rummel; (1 pg), filed Oct. 14, 2008.
Response to Examiner's Election/Restriction Requirement re: OA mailed Jan. 12, 2009; U.S. Appl. No. 11/420,184, filed May 24, 2006, in the name of Kerrin A. Rummel; (7 pgs), filed Feb. 12, 2009.
European Search Report and Communication; JL38696P.EPP / 07251481.3-1235 / 1860695; 9 pages, May 20, 2010.

* cited by examiner

| 800 WATTS HEAT |
|---|
| AVERAGE SPREADER BASE TEMPERATURE OF 76°C WITH 63°C BOILING POINT COOLANT |
| MAXIMUM TR TO TR SITE TEMPERATURE DIFFERENCE OF 2.8°C |
| 800 ml/min TOTAL FLOW RATE |

| 800 WATTS HEAT |
|---|
| AVERAGE SPREADER BASE TEMPERATURE OF 82°C WITH 63°C BOILING POINT COOLANT |
| MAXIMUM TR TO TR SITE TEMPERATURE DIFFERENCE OF 1.9°C |
| 140 ml/min TOTAL FLOW RATE |

SYSTEM AND METHOD OF BOILING HEAT TRANSFER USING SELF-INDUCED COOLANT TRANSPORT AND IMPINGEMENTS

RELATED APPLICATIONS

This application is a Divisional of U.S. patent Ser. No. 11/465,372 filed on Aug. 17, 2006 which is a Continuation-in-Part of U.S. patent application Ser. No. 11/290,065 filed on Nov. 30, 2005.

TECHNICAL FIELD OF THE INVENTION

This invention relates generally to the field of cooling systems and, more particularly, to a system and method of boiling heat transfer using self-induced coolant transport and impingements.

BACKGROUND OF THE INVENTION

A variety of different types of structures can generate heat or thermal energy in operation. To prevent such structures from over heating, a variety of different types of cooling systems may be utilized to dissipate the thermal energy. To facilitate the dissipation of such thermal energy in such cooling systems, a variety of different types of coolants may be utilized.

SUMMARY OF THE INVENTION

According to one embodiment of the invention, a cooling system for a heat-generating structure comprises a chamber and structure disposed within the chamber. The chamber has an inlet and an outlet. The inlet receives fluid coolant into the chamber substantially in the form of a liquid. The outlet dispenses the fluid coolant out of the chamber at least partially in the form of a vapor. The structure disposed within the chamber receive thermal energy from the heat generating structure and transfers at least a portion of the thermal energy to the fluid coolant. The thermal energy from the heat-generating structure causes at least a portion of the fluid coolant substantially in the form of a liquid to boil and effuse vapor upon contact with a portion of the structure. The effusion of vapor creates a self-induced flow in the chamber. The self-induced flow distributes non-vaporized fluid coolant substantially in the form of a liquid to other portions of the structure.

Certain embodiments of the invention may provide numerous technical advantages. For example, a technical advantage of one embodiment may include the capability to enhance heat transfer in a coolant stream. Other technical advantages of other embodiments may include the capability to utilize pin fin configurations to alter the heat transfer phenomenology and thereby enhance the transfer of thermal energy. Yet other technical advantages of other embodiments may include the capability to reduce a flow requirement into a chamber utilized for heat transfer.

Although specific advantages have been enumerated above, various embodiments may include all, some, or none of the enumerated advantages. Additionally, other technical advantages may become readily apparent to one of ordinary skill in the art after review of the following figures and description.

BRIEF DESCRIPTION OF THE DRAWINGS

For a more complete understanding of example embodiments of the present invention and its advantages, reference is now made to the following description, taken in conjunction with the accompanying drawings, in which:

FIGS. 5A-6C show a comparison of two heat load test articles;

DETAILED DESCRIPTION OF EXAMPLE EMBODIMENTS OF THE INVENTION

It should be understood at the outset that although example embodiments of the present invention are illustrated below, the present invention may be implemented using any number of techniques, whether currently known or in existence. The present invention should in no way be limited to the example embodiments, drawings, and techniques illustrated below, including the embodiments and implementation illustrated and described herein. Additionally, the drawings are not necessarily drawn to scale.

Figure 1:
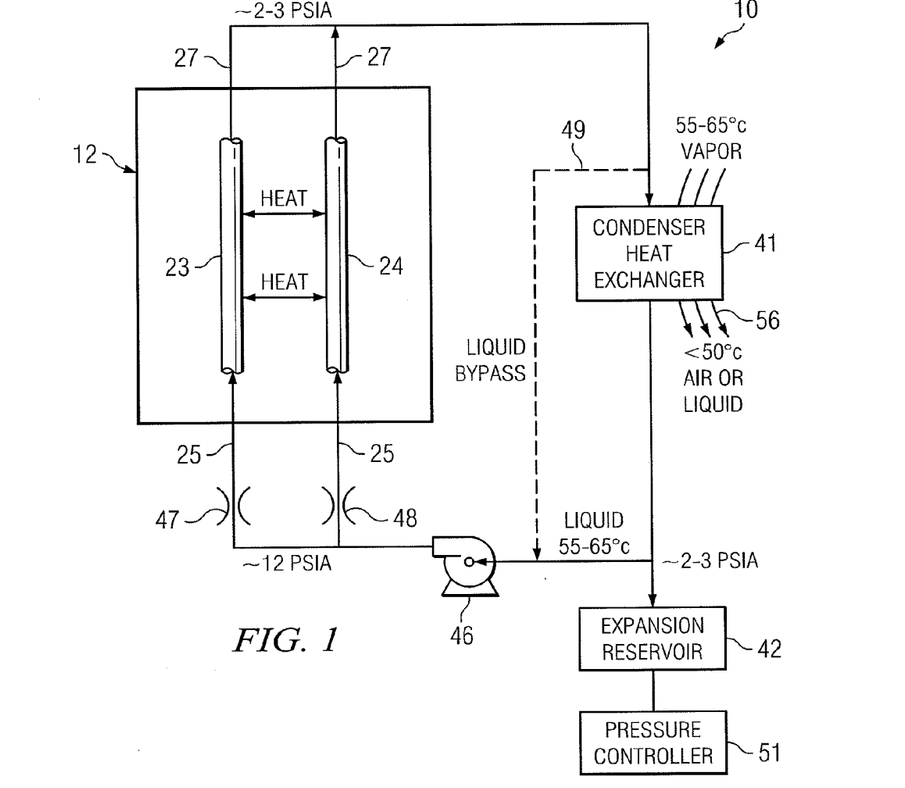
FIG. 1 is a block diagram of an embodiment of a cooling system that may be utilized in conjunction with other embodiments.

FIG. 1 is a block diagram of an embodiment of a cooling system 10 that may be utilized in conjunction with other embodiments disclosed herein, namely surface enhancement embodiments described with reference to FIGS. 3A-4D and FIGS. 6A-6C. Although the details of one cooling system will be described below, it should be expressly understood that other cooling systems may be used in conjunction with embodiments of the invention.

The cooling system 10 of FIG. 1 is shown cooling a structure 12 that is exposed to or generates thermal energy. The structure 12 may be any of a variety of structures, including, but not limited to, electronic components, modules, and circuits. Because the structure 12 can vary greatly, the details of structure 12 are not illustrated and described. The cooling system 10 of FIG. 1 includes channels 23 and 24, pump 46, inlet orifices 47 and 48, a condenser heat exchanger 41, an expansion reservoir 42, and a pressure controller 51.

The structure 12 may be arranged and designed to conduct heat or thermal energy to the channels 23, 24. To receive this thermal energy or heat, the channels 23, 24 may be disposed on an edge of the structure 12 or may extend through portions of the structure 12, for example, through a thermal plane of structure 12. In particular embodiments, the channels 23, 24 may extend up to the components of the structure 12, directly receiving thermal energy from the components. Further, in particular embodiments the channels 23, 24 may be cold walls. Although two channels 23, 24 are shown in the cooling system 10 of FIG. 1, one channel or more than two channels may be used to cool the structure 12 in other cooling systems.

In operation, a fluid coolant flows through each of the channels 23, 24. As discussed later, this fluid coolant may be a two-phase fluid coolant, which enters inlet conduits 25 of channels 23, 24 in liquid form. Absorption of heat from the structure 12 causes part or all of the liquid coolant to boil and vaporize such that some or all of the fluid coolant leaves the exit conduits 27 of channels 23, 24 in a vapor phase. To facilitate such absorption or transfer of thermal energy, the channels 23, 24 may be lined with pin fins or other similar surface enhancement devices which, among other things, increase surface contact between the fluid coolant and walls of the channels 23, 24. Further details of the surface enhancement configurations, namely pin fin configurations, are described below with reference to FIGS. 3A-4D and FIGS. 6A-6C.

The fluid coolant departs the exit conduits 27 and flows through the condenser heat exchanger 41, the expansion reservoir 42, a pump 46, and a respective one of two orifices 47 and 48, in order to again to reach the inlet conduits 25 of the channels 23, 24. The pump 46 may cause the fluid coolant to circulate around the loop shown in FIG. 1. In particular embodiments, the pump 46 may use magnetic drives so there are no shaft seals that can wear or leak with time.

The orifices 47 and 48 in particular embodiments may facilitate proper partitioning of the fluid coolant among the respective channels 23, 24, and may also help to create a large pressure drop between the output of the pump 46 and the channels 23, 24 in which the fluid coolant vaporizes. The orifices 47 and 48 may have the same size, or may have different sizes in order to partition the coolant in a proportional manner which facilitates a desired cooling profile.

A flow 56 of fluid (either gas or liquid) may be forced to flow through the condenser heat exchanger 41, for example by a fan (not shown) or other suitable device. In particular embodiments, the flow 56 of fluid may be ambient fluid. The condenser heat exchanger 41 transfers heat from the fluid coolant to the flow 56 of ambient fluid, thereby causing any portion of the fluid coolant which is in the vapor phase to condense back into a liquid phase. In particular embodiments, a liquid bypass 49 may be provided for liquid fluid coolant that either may have exited the channels 23, 24 or that may have condensed from vapor fluid coolant during travel to the condenser heat exchanger 41.

The liquid fluid coolant exiting the condenser heat exchanger 41 may be supplied to the expansion reservoir 42. Since fluids typically take up more volume in their vapor phase than in their liquid phase, the expansion reservoir 42 may be provided in order to take up the volume of liquid fluid coolant that is displaced when some or all of the coolant in the system changes from its liquid phase to its vapor phase. The amount of the fluid coolant which is in its vapor phase can vary over time, due in part to the fact that the amount of heat or thermal energy being produced by the structure 12 will vary over time, as the structure 12 system operates in various operational modes.

Turning now in more detail to the fluid coolant, one highly efficient technique for removing heat from a surface is to boil and vaporize a liquid which is in contact with a surface. As the liquid vaporizes in this process, it inherently absorbs heat to effectuate such vaporization. The amount of heat that can be absorbed per unit volume of a liquid is commonly known as the latent heat of vaporization of the liquid. The higher the latent heat of vaporization, the larger the amount of heat that can be absorbed per unit volume of liquid being vaporized.

The fluid coolant used in the embodiment of FIG. 1 may include, but is not limited to mixtures of antifreeze and water. In particular embodiments, the antifreeze may be ethylene glycol, propylene glycol, methanol, or other suitable antifreeze. In other embodiments, the mixture may also include fluoroinert. In particular embodiments, the fluid coolant may absorb a substantial amount of heat as it vaporizes, and thus may have a very high latent heat of vaporization.

Water boils at a temperature of approximately 100° C. at an atmospheric pressure of 14.7 pounds per square inch absolute (psia). In particular embodiments, the fluid coolant's boiling temperature may be reduced to between 55-65° C. by subjecting the fluid coolant to a subambient pressure of about 2-3 psia. Thus, in the cooling system 10 of FIG. 1, the orifices 47 and 48 may permit the pressure of the fluid coolant downstream from them to be substantially less than the fluid coolant pressure between the pump 46 and the orifices 47 and 48, which in this embodiment is shown as approximately 12 psia. The pressure controller 51 maintains the coolant at a pressure of approximately 2-3 psia along the portion of the loop which extends from the orifices 47 and 48 to the pump 46, in particular through the channels 23 and 24, the condenser heat exchanger 41, and the expansion reservoir 42. In particular embodiments, a metal bellows may be used in the expansion reservoir 42, connected to the loop using brazed joints. In particular embodiments, the pressure controller 51 may control loop pressure by using a motor driven linear actuator that is part of the metal bellows of the expansion reservoir 42 or by using small gear pump to evacuate the loop to the desired pressure level. The fluid coolant removed may be stored in the metal bellows whose fluid connects are brazed. In other configurations, the pressure controller 51 may utilize other suitable devices capable of controlling pressure.

In particular embodiments, the fluid coolant flowing from the pump 46 to the orifices 47 and 48 may have a temperature of approximately 55° C. to 65° C. and a pressure of approximately 12 psia as referenced above. After passing through the orifices 47 and 48, the fluid coolant may still have a temperature of approximately 55° C. to 65° C., but may also have a lower pressure in the range about 2 psia to 3 psia. Due to this reduced pressure, some or all of the fluid coolant will boil or vaporize as it passes through and absorbs heat from the channels 23 and 24.

After exiting the exits ports 27 of the channels 23, 24, the subambient coolant vapor travels to the condenser heat exchanger 41 where heat or thermal energy can be transferred from the subambient fluid coolant to the flow 56 of fluid. The flow 56 of fluid in particular embodiments may have a temperature of less than 50° C. In other embodiments, the flow 56 may have a temperature of less than 40° C. As heat is removed from the fluid coolant, any portion of the fluid which is in its vapor phase will condense such that substantially all of the fluid coolant will be in liquid form when it exits the condenser heat exchanger 41. At this point, the fluid coolant may have a temperature of approximately 55° C. to 65° C. and a subambient pressure of approximately 2 psia to 3 psia. The fluid coolant may then flow to pump 46, which in particular embodiments 46 may increase the pressure of the fluid coolant to a value in the range of approximately 12 psia, as mentioned earlier. Prior to the pump 46, there may be a fluid connection to an expansion reservoir 42 which, when used in conjunction with the pressure controller 51, can control the pressure within the cooling loop.

It will be noted that the embodiment of FIG. 1 may operate without a refrigeration system. In the context of electronic circuitry, such as may be utilized in the structure 12, the absence of a refrigeration system can result in a significant reduction in the size, weight, and power consumption of the structure provided to cool the circuit components of the structure 12.

Although components of one embodiment of a cooling system 10 have been shown in FIG. 1, it should be understood that other embodiments of the cooling system 10 can include more, less, or different component parts. For example, although specific temperatures and pressures have been described for one embodiment of the cooling system, other embodiments of the cooling system 10 may operate at different pressures and temperatures. Additionally, in some embodiments a coolant fill port and/or a coolant bleed port may be utilized with metal-to-metal caps to seal them. Further, in some embodiments, all or a portion of the joints between various components may be brazed, soldered or welded using metal-to-metal seal caps.

In boiling heat transfer, there are four general ways in which a fluid interacts with a surface: (1) pool boiling, (2) flow boiling, (3) jet impingement cooling, and (4) spray cooling. With pool boiling, a volume of coolant comes in contact with a heated surface and the coolant is not forced to flow over the surface using a pump or other forcible method. Rather, gravity feeds coolant to the heated surface to replenish the coolant that has turned to vapor. Pool boiling reaches a limit when the effusing vapor does not allow for adequate coolant replenishment. When this happens, a film of vapor develops between the heated surface and the body of coolant as the boiling action transitions to film boiling. As a result, a higher temperature of the heated surface is required to drive the heat through the vapor film for boiling to happen at the vapor-liquid interface. When this happens the heat transfer coefficient drops significantly resulting in poor transfer of heat.

With flow boiling, coolant is forced to flow across the heated surface. As a result, vapor bubbles are washed away allowing for liquid coolant to replenish the coolant that has vaporized. This approach, in general, supports higher heat fluxes and yields higher heat transfer coefficients than pool boiling. Flow boiling has a limit at which there can be so much vapor produced that even a forced flow of coolant can not ensure adequate wetting of the heated surface. Flow boiling can also transition to film boiling, but generally at significantly higher heat fluxes than pool boiling.

With jet impingement cooling, coolant is forced to impinge the heated surface due to the momentum of the coolant coming out of a jet. The coolant forcibly passes through any vapor bubbles or a vapor film to wet the heated surface and pushes the vapor bubbles outward along the heated surface. Once the coolant flow is away from the area of impingement, the coolant flow behaves like flow boiling as there is no more impingement action to penetrate a volume of bubbles or a vapor film.

Spray cooling creates a mist or stream of coolant drops that impact the heated surface. In this case a thin liquid film of coolant is "painted" on the surface. As the coolant vaporizes, it is replenished by a continuing stream of mist from the spay head. Because spray nozzles for spray cooling are typically positioned at an appreciable distance from the heated surface, spray cooling is unsuitable for particular applications, namely densely packaged electronics.

Figure 2A:
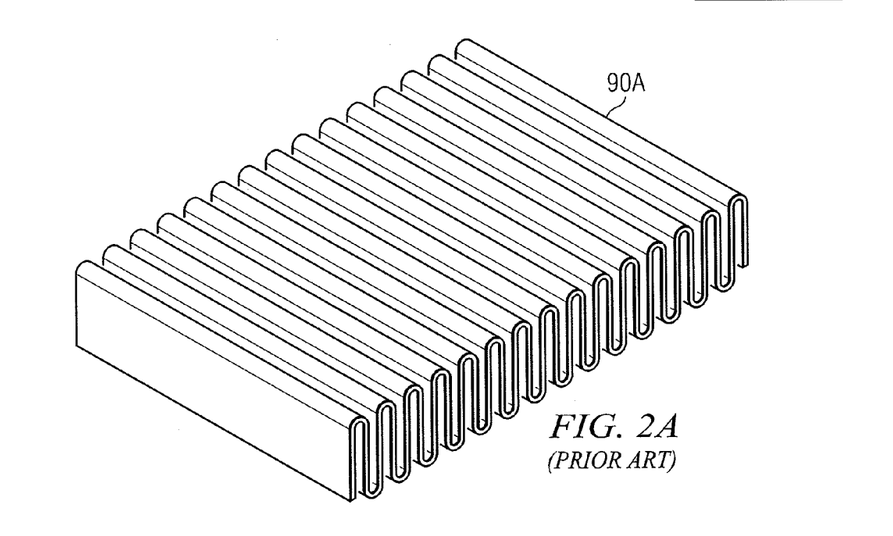
FIGS. 2A-2C illustrate conventional coldplate configurations.
Figure 2B:
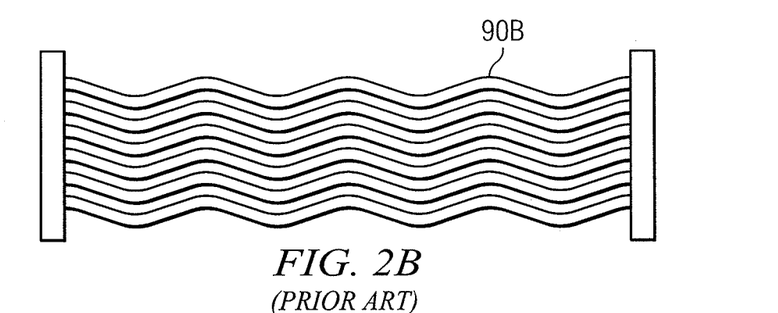
Figure 2C:
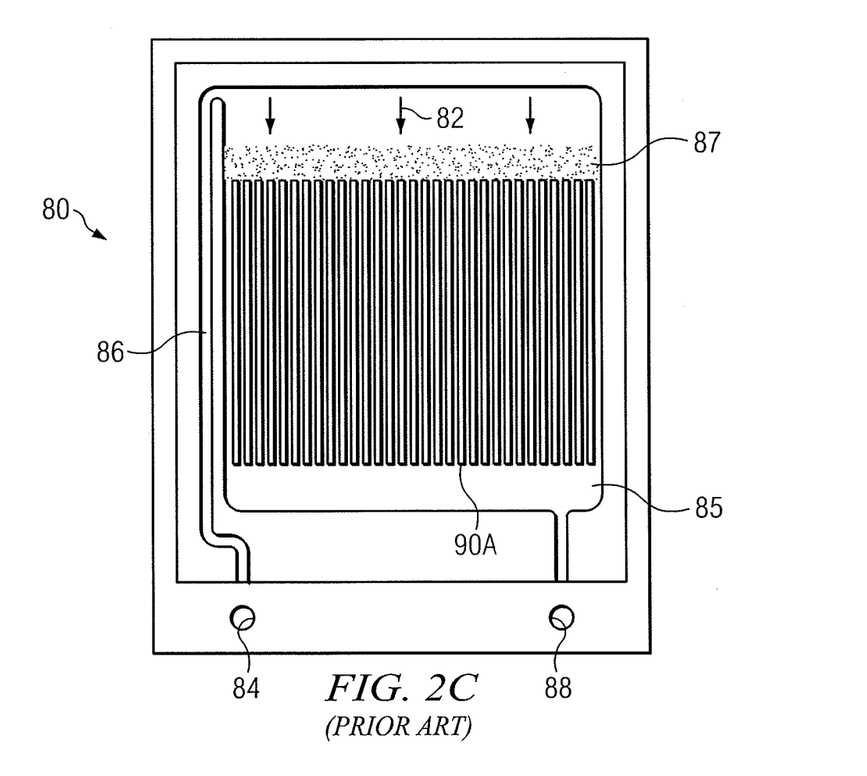

FIGS. 2A-2C illustrate conventional coldplate configurations. FIG. 2A shows straight fin stock 90A that can be used in a coldplate; FIG. 2B shows wavy fin stock 90A that can be used in a coldplate; and FIG. 2C shows a cross sectional view of a coldplate 80 with straight fin stock 90A. With reference to FIG. 2C, thermal energy or heat from a structure is transferred to the coldplate 80, then to the straight fin stock 90A, and then to a cross-flowing coolant stream (illustrated by arrow 82) within the coldplate 80. To facilitate this flow, the coldplate 80 may include features such as an inlet 84, an inlet passage 86, a porous foam header 87, a chamber 85, and an outlet 88. In operation, coolant generally flows parallel to the coldplate surface through the chamber 85 and through channels created by the walls of the straight fin stock 90A.

For conventional two-phase coldplates to be efficient, coolant typically flows in excess of that needed for energy balance to ensure wetting of the surfaces by forcing the removal of created vapor—thereby preventing surfaces from transitioning to film boiling. In an energy balance, a flow rate of "1×" is the amount of flow necessary to absorb thermal energy with 100% conversion—that is, one unit of liquid is put in that totally goes to vapor and takes out all the heat. For coldplates that require low temperature gradients, the required flow rate can be many times that needed for energy balance (1×)—that is, flow rates on the order of 3×, 4×, 5×, or 6×. This is due to the confining action of the walls of the fin stock, which create channels that allow the effusing vapor to hold the liquid off the walls thus preventing wetting. Thus, such conventional configurations need very high flow rates to allow the momentum of the liquid stream to overcome the ability of the effusing vapor to hold the liquid trapped in the vapor stream.

To overcome the action of the vapor that prevents wetting of the walls, the above-referenced jet impingement cooling or spray cooling may be utilized. Although jet impingement and spray cooling work well, they are more complex and may not be able to be used due to packaging limitations. Accordingly, teaching of some embodiments of the invention recognize that pin fins configurations can be utilized to alter the heat transfer phenomenology and thereby enhance heat transfer. In some of such embodiments, when a small amount of liquid enters a field of pin fins, a violent, exploding, and chaotic reaction occurs as liquid vaporizes. This reaction disperses the unvaporized liquid as globs amongst the pin fins in a Brownian motion-like or stochastic-like manner. This dispersion can create jet impingement-like and spray-like qualities with a low flow rate.

Figure 3A:
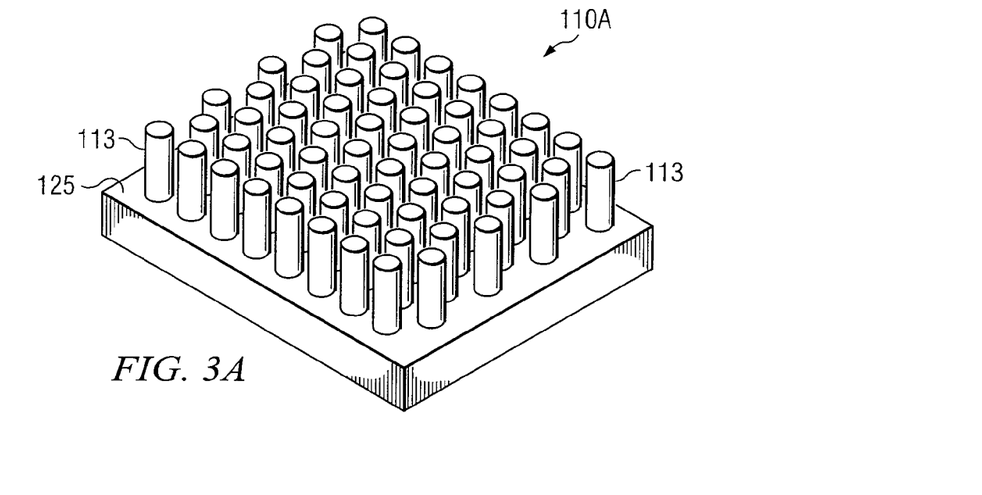
FIG. 3A is an isolated perspective view of a pin fin configuration and FIG. 3B is a side cross-sectional view of a pin fin configuration that may be utilized in embodiments of the invention.
Figure 3B:
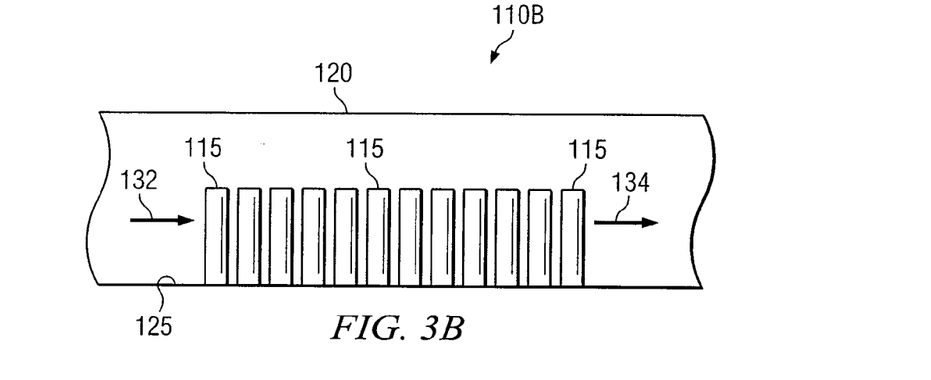

FIG. 3A is an isolated perspective view of a pin fin configuration 110A and FIG. 3B is a side cross-sectional view of a pin fin configuration 110B that may be utilized in embodiments of the invention. In particular embodiments, the pin fin configurations 110A, 110B may be disposed within the channels 23, 24 described with reference to FIG. 1. In other embodiments, the pin fin configurations 110A, 110B may be disposed in other heat transfer structures. For purposes of illustration, the pin fin configurations 110A, 110B will be described as being disposed in a channel operable to receive fluid. The pin fin configurations 110A, 110B of FIGS. 2A and 2B are examples of surface enhancements that may be utilized to enhance the transfer of thermal energy from a heat generating structure to a fluid. Other types of surface enhancements that may be utilized with other embodiments of the invention include, but are not limited to, conductive foam and conductive fibers.

With reference to FIGS. 3A and 3B, a plurality of pin fins 113, 115 protrude from channel walls 125 and are arranged in pin fin configurations 110A, 110B. Pin fin configuration 110A shows a staggered arrangement and pin fin configuration 110B shows an inline arrangement. FIG. 3B additionally shows a channel 120 with a fluid flow towards the pin fin configuration 110B, indicated by arrow 132, and a fluid flow away from the pin fin configuration 110B, indicated by arrow 134. In operation, thermal energy is transferred to the pin fins 113, 115 (e.g., from the channel wall 125 to the pin fins 113, 115) and to a fluid traveling through the channel, for example, channel 120. In particular embodiments, the pin fin configurations 110A, 110B may be utilized to enhance boiling heat transfer. In such embodiments, liquid fluid coolant (e.g., traveling in direction of arrow 132 towards the pin fins 113, 115) comes in contact with the pin fins 113, 115 and is boiled and vaporized. The vaporized fluid coolant (e.g., traveling away from the pin fins in direction of arrow 134) inherently contains the thermal energy transferred from the pin fins 113, 115 to the fluid coolant during vaporization. As described in further details below, the fluid flow in particular embodiments may be relatively slow, allowing a reduction in components that are used to create the fluid flow (e.g., pumps, conduits, etc.). Further, in particular embodiments, components may not be necessary to create a fluid flow, for example, in gravity-fed embodiments.

In particular embodiments, pin fins 113, 115, may be used inside a coldplate, allowing the coolant to move in multiple directions since there are no confining walls. At high heat fluxes, the effusing vapor creates a violent and near chaotic flow with liquid entrained in the vapor. Because the effusing vapor is confined to the core of the coldplate, its motion is internal to the core thus forcing it over the pin fins 113, 115. As the vapor effuses, it transports unvaporized liquid coolant in a near chaotic swirl, which results in the pin fins being impinged with liquid coolant. The vapor produced at all sites of the pin fins 113, 115 collectively energizes the swirl of vapor with liquid embedded in it. Additionally, globs of liquid coolant (e.g., formed from the vaporization of other liquid coolant) are thrown against downstream pin fins 113, 115—creating a spray cooling-like quality. Accordingly, the pin fin configurations 110A, 110B allow a cross flowing coolant to be used while taking advantage of the attributes of jet impingement and spray cooling, which are provided by the chaotic cross flowing liquid impacting the pin fins 113, 115. Such a phenomenology in particular embodiments may result in a need for less coolant flow rate because the effusing vapor self induces the flow of coolant and creates a form of spray cooling or jet impingement cooling as the liquid impinges the pins. In other words, the spraying effect in particular embodiments is self-induced by the effusing vapor—that is, the energizing means for the spraying effect is the effusing vapor itself.

As referenced above, in particular embodiments relatively small flow rates may be used with pin fin configurations. In some of such embodiments, reduced pumping requirements, reduced sizes of flow lines, and the like may be achieved. Generally, a flow rate of "1×" is the amount of flow necessary to absorb thermal energy with 100% conversion—that is, one unit of liquid is put in that totally goes to vapor and takes out all the heat. To ensure proper wetting, for example in conventional configurations described above, flow rates must typically be on the order of 3×, 4×, 5×, or 6×. Such flow rates provide excessive amount of liquids. In particular embodiments, such conventional configurations can be contrasted with pin fin configurations in which the chaotic action reduces the flow rate towards 1×. For example, in particular embodiments, flow rate requirements for pin fin configurations can be 1.1×, 1.2×, or 1.3×. Thus, a dribble of liquid can be provided at the opening of the chamber housing the pin fins. Upon the liquid contacting the pin fins, the chaotic reaction occurs dispersing the liquid in a Brownian motion-like manner amongst all pin fins in the chamber.

A further benefit of the above referenced distribution in particular embodiments is small temperature differentials amongst the pin fins. Because the chaotic reaction creates Brownian motion-like distributions, the—result is a near-equal energy transfer distribution amongst pin fins—that is, each of the pins fins is allowed to transfer its thermal energy to the fluid in more equal-like manner. Thus, the chaos of the effusing action creates order in the thermal energy transfer. In particular embodiments, temperature differentials amongst pin fins can be on the order of one degrees Celsius.

A yet further benefit of the above referenced distribution in particular embodiments is prevention of excess fluid. Excess fluid is created by either excess flows or spray nozzles that spray outside of an effective thermal transfer area. In particular embodiments, fluid slightly above that needed for energy balance (1×) may be placed in the chamber of pin fins and the chaotic action will equally distribute the fluid amongst the pin fins.

Figure 7:
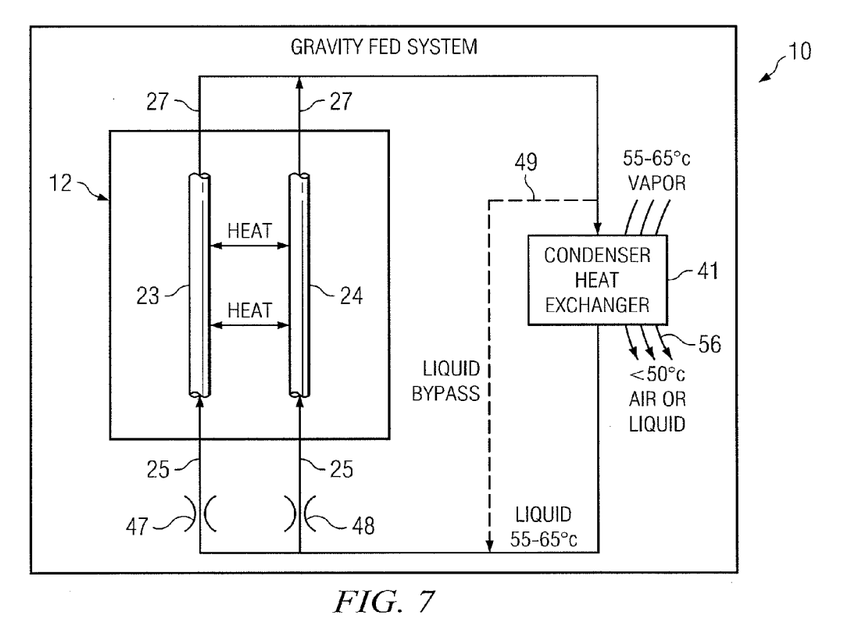
FIG. 7 is a block diagram of an embodiment of a cooling system that is gravity fed.
Figure 8:
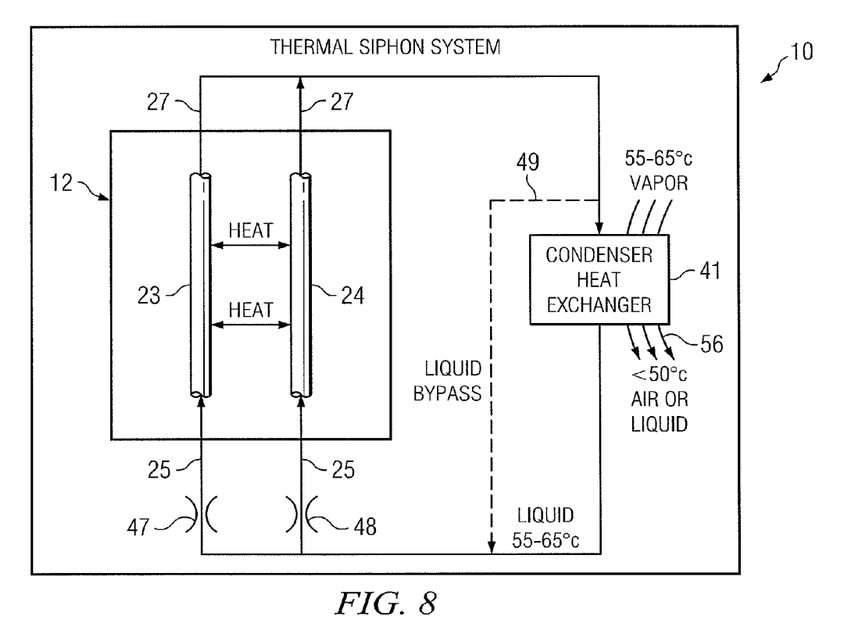
FIG. 8 is a block diagram of an embodiment of a cooling system comprising a thermal siphon.

In particular embodiments, no powering mechanism (e.g., a pump or the like) is needed to create a flow in the system. Rather, flow may be gravity fed to the pins fins (as is seen in FIG. 7) where the liquid is vaporized. The vaporized liquid travels away from the pin fins, condenses in a separate area of the system and then is gravity fed back to the pin fins. Systems similar to this are sometimes referred to as thermal siphons (as is seen in FIG. 8).

The pin fins 113, 115 may be made of a variety of materials and may take on a variety of sizes and shapes. In this embodiment, the pin fins are made of a nickel plated copper and vary in size from 0.04 inches high to 0.1675 inches high. The pin fins 113, 115 are shown with a columnar shape. In other embodiments, the pin fins 113, 115 may be made of other materials, may have heights less than 0.04 inches, may have heights greater than 0.1675 inches, and may have shapes other than columnar shapes. Additionally, in other embodiments the pin fins 113, 115 may be arranged in configurations other than inline or staggered configurations. Further, in particular embodiments, the pin fins may be made of a conductive foam or conductive fiber.

Figure 4A:
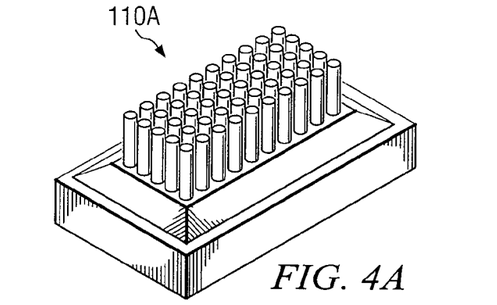
FIGS. 4A, 4B, 4C, and 4D show pin fin configurations, according to embodiments of the invention.
Figure 4B:
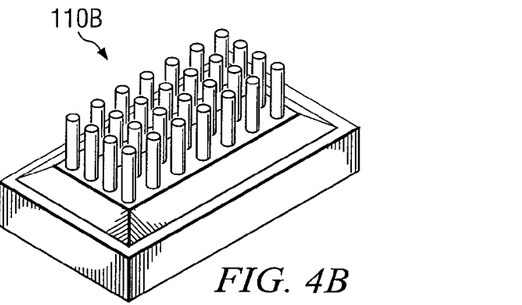
Figure 4C:
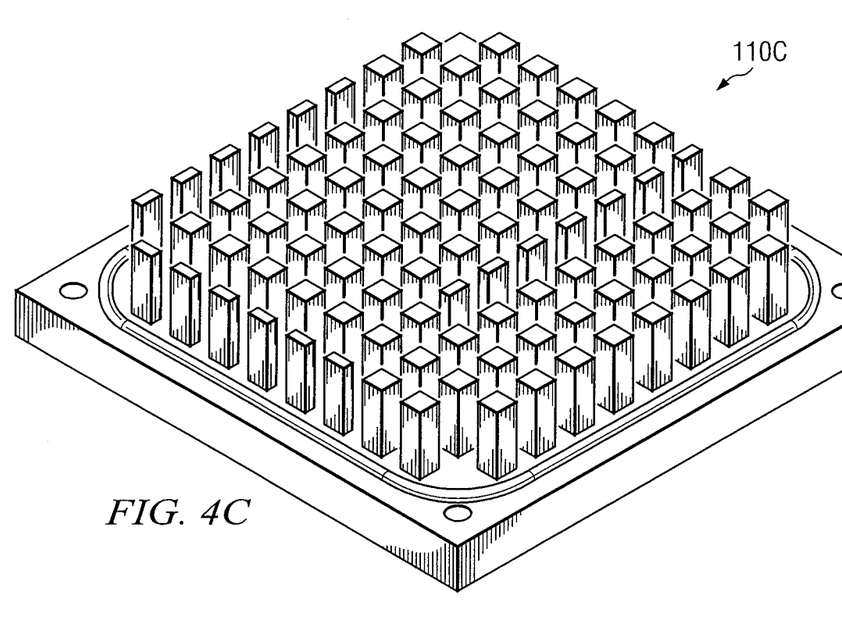
Figure 4D:
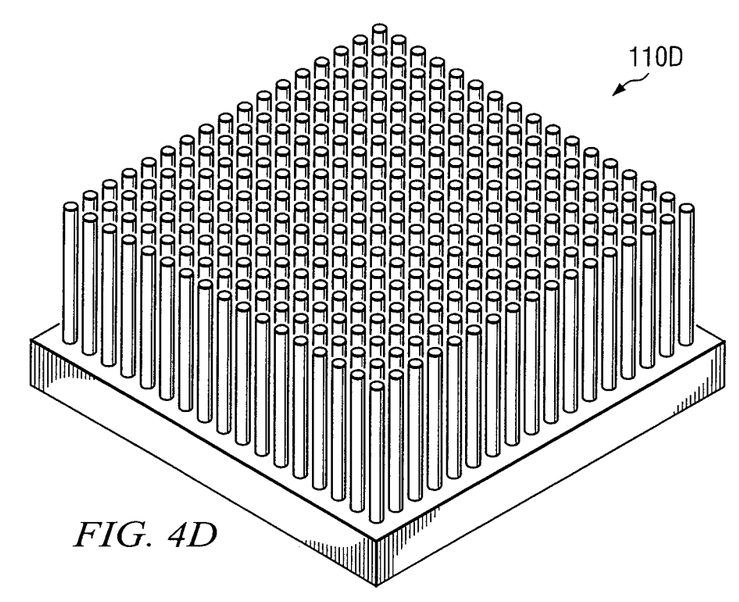

FIGS. 4A, 4B, 4C, and 4D show pin fin configurations 110A, 110B, 110C, and 110D, according to embodiments of the invention. Pin fin configuration 110A of FIG. 4A is an inline configuration, pin fin configuration 110B of FIG. 4B is an inline configuration, pin fin configuration 110C of FIG. 4C is an inline configuration with square columns, and pin fin configuration 110D of FIG. 4D is an inline configuration with long tubular columns. The pin fin configurations 110A, 110B, 110C, and 110D of FIGS. 4A, 4B, 4C, and 4D illustrate only some of the many configurations that may be utilized, according to embodiments of the invention.

Figure 5A:
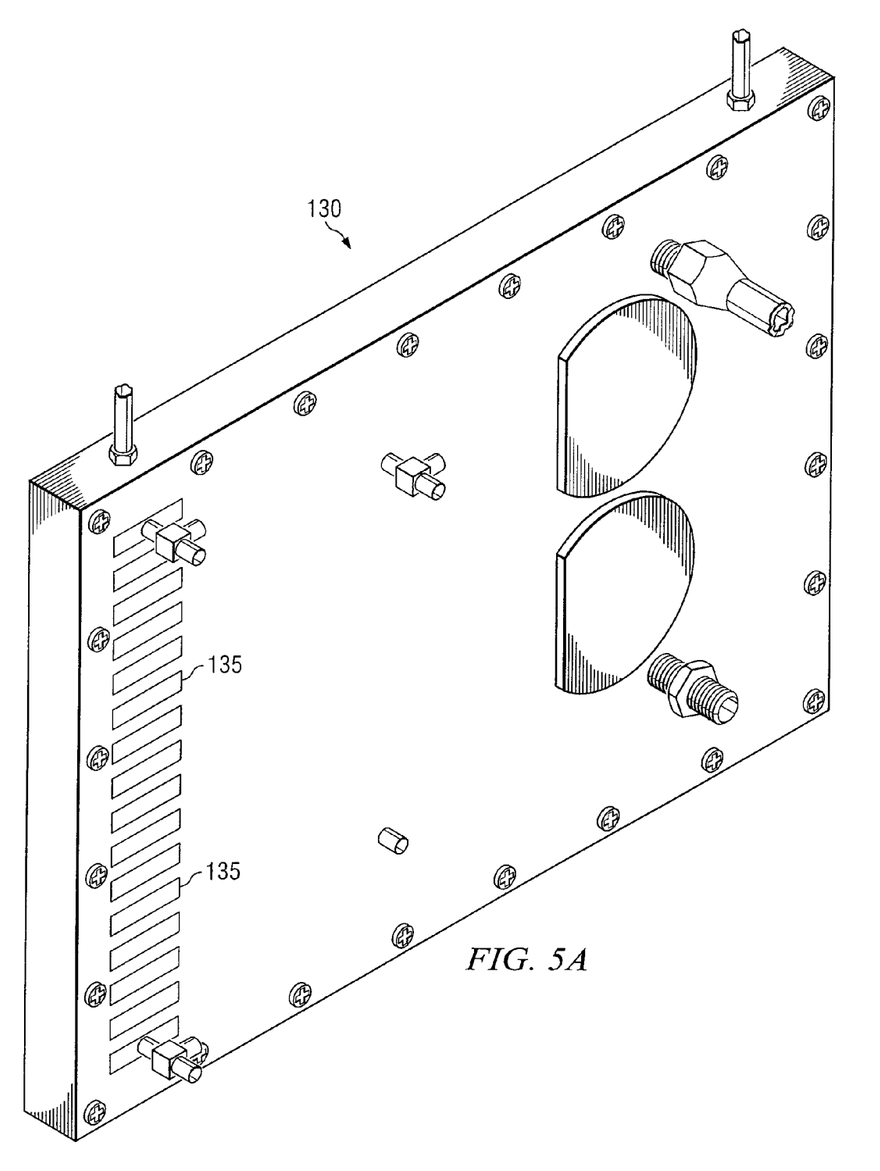
Figures 5B, 5C:
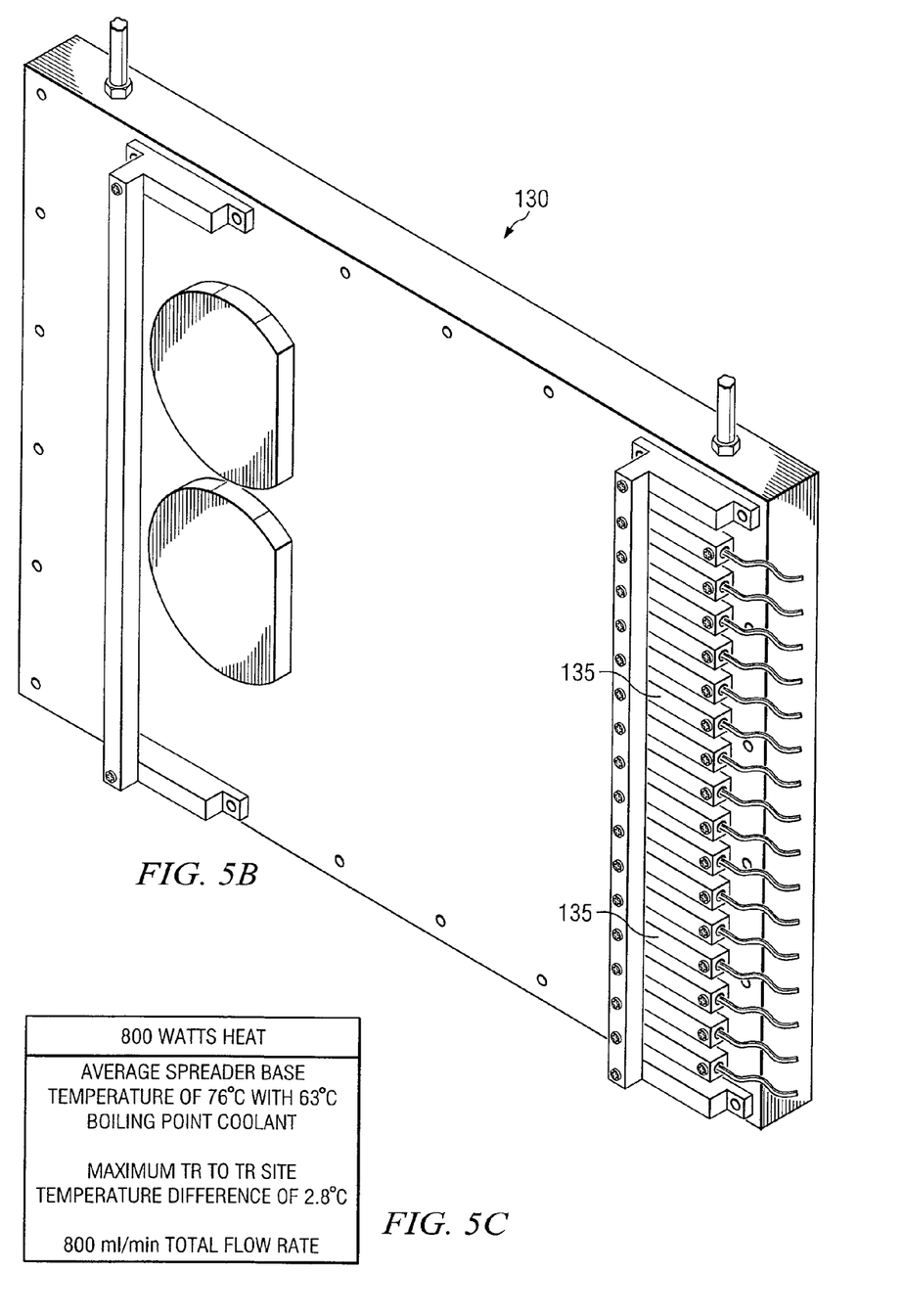
Figure 6A:
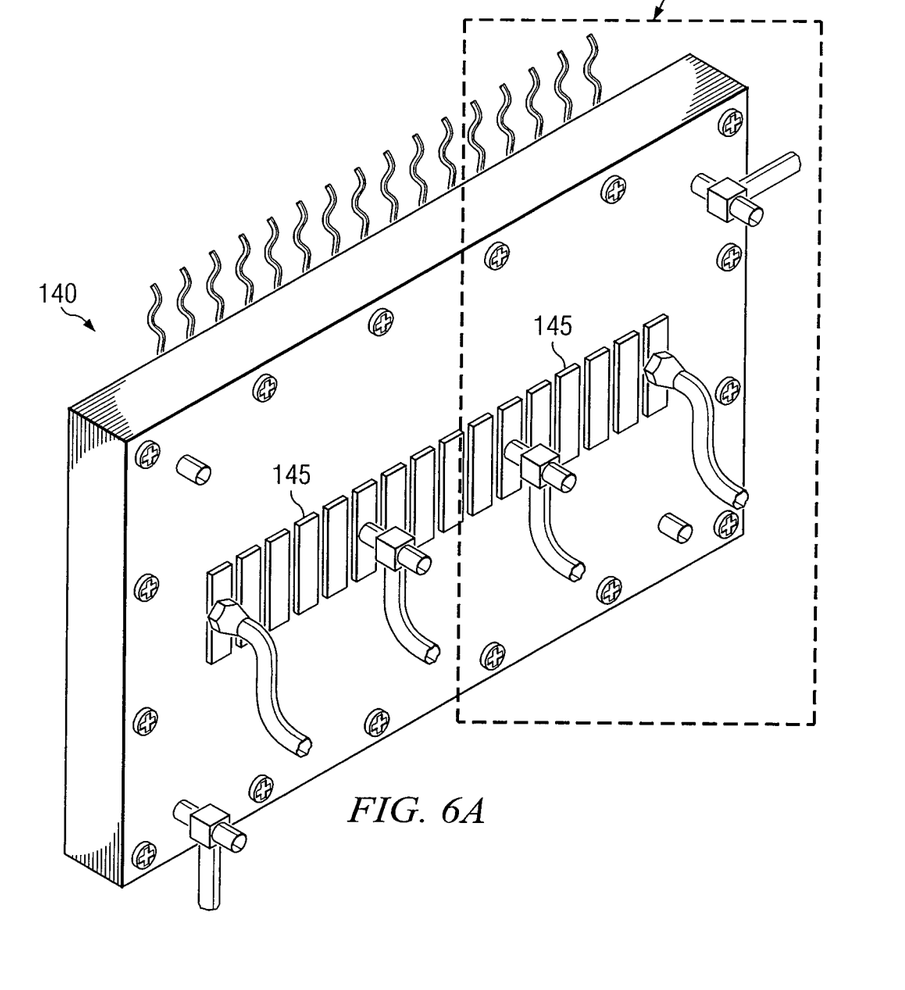
Figure 6B:
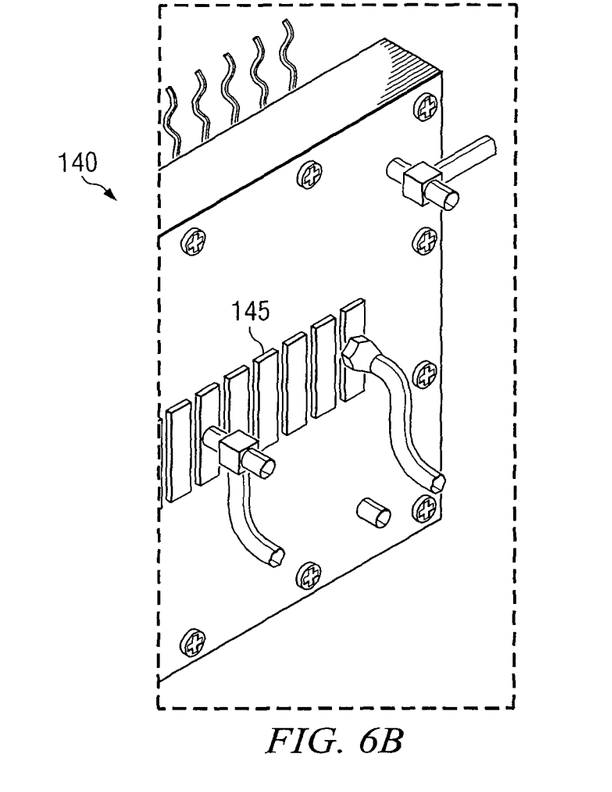
Figure 6C:
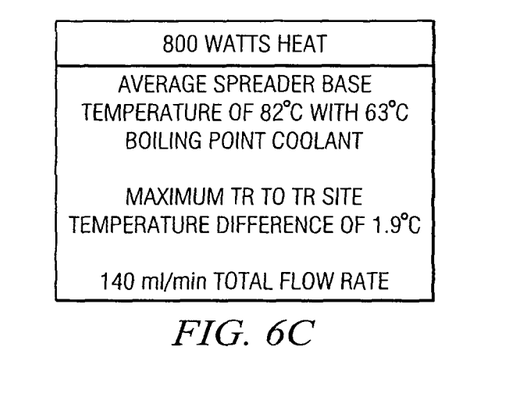

FIGS. 5A-6C show a comparison of two heat load test articles. FIGS. 5A, 5B, and 5C illustrate a conventional forced flow configuration 130 and it associated parameters. FIGS. 6A, 6B, and 6C illustrate a pin fin configuration 140 and its associated parameters. The forced flow configuration 130 shown in FIGS. 5A and 5B uses a forced flow of cross-flowing coolant that is supplied to each of sixteen heated blocks 135. FIG. 5A shows one side of the test assembly and FIG. 5B shows the opposite side of the test assembly.

The pin fin configuration 140 of FIGS. 6A and 6B show pin fins on each of sixteen heated blocks 145. The pin fins create the chaotic reaction referenced above. In comparing the parameters associated with each as shown in FIGS. 5C and 6C, the assembly of FIGS. 6A and 6B has almost 82% less coolant (140 ml/min versus 800 ml/min) for the 800 Watt heat load. Further, the maximum temperature differentials of the transmit/receive (TR) sites is 2.8 degrees Celsius in the FIG. 5C and 1.9 degrees Celsius in the FIG. 5C for the 800 Watt heat load. Thus, in particular embodiments, the assembly of FIGS. 6A and 6B would be preferred over the assembly of FIGS. 5A and 5B.

The embodiments of pin fin configurations may be utilized in a variety of configurations including but not limited to:
1) High Power Phased Arrays—for high powered phase arrays to cool the transmit-receive (TR) functions and power supplies.
2) Cooling of Electronic Chassis—for removing heat from the cold walls of electronic chassis.
3) Micro Channel Cooling—Micro channel cooling may be used to cool single electronic chips, small circuit assemblies, and device die.

4) Heat Exchangers—There are two-phase heat exchangers built using straight and wavy fin stock. Some of these may perform better and be less expensive if built using pin fins.

Although the present invention has been described with several embodiments, a myriad of changes, variations, alterations, transformations, and modifications may be suggested to one skilled in the art, and it is intended that the present invention encompass such changes, variations, alterations, transformation, and modifications as they fall within the scope of the appended claims.

What is claimed is:

1. A method for cooling a heat-generating structure, the method comprising:
    transferring thermal energy from the heat-generating structure to a pin fin structure disposed in a chamber, wherein pin fins of the pin fin structure are arranged in a pattern with a first portion of the pin fins having a first shape and a second portion of the pin fins having a second shape, the second portion of the pin fins arranged along two sides of the pattern and in a row within the pattern;
    introducing a fluid coolant into the chamber;
    exposing the fluid coolant to at least a portion of the pin fin structure disposed in the chamber, thereby causing a portion of the fluid coolant substantially in liquid form to boil and effuse vapor during a transfer of the thermal energy from the at least the portion of the pin fin structure to the fluid coolant, the effused vapor creating a self-induced flow in the chamber;
    distributing the fluid coolant substantially in the liquid form to other portions of the pin fin structure using the self-induced flow; and
    transferring at least a portion of the thermal energy from the other portions of the pin fin structure to the distributed fluid coolant.

2. The method of claim 1, wherein the self-induced flow is chaotic.

3. The method of claim 1, wherein:
    the pin fins include upstream pin fins and downstream pin fins;
    the fluid coolant is exposed to the upstream pin fins; and
    the self-induced flow distributes the fluid coolant to the downstream pin fins.

4. The method of claim 3, wherein the fluid coolant is distributed to the downstream pin fins by a spraying effect energized by the effused vapor.

5. The method of claim 3, wherein the effused vapor creates a jet impingement of the fluid coolant upon at least a portion of the pin fins.

6. The method of claim 1, wherein the self-induced flow includes globs of the fluid coolant substantially in the liquid form thrown against the other portions of the pin fin structure.

7. The method of claim 1, further comprising:
    creating a maximum temperature differential between different portions of the pin fin structure disposed in the chamber to less than two degrees Celsius.

8. The method of claim 1, wherein a flow of the fluid coolant into the chamber is gravity fed.

9. The method of claim 1, further comprising:
    operating the chamber and the pin fin structure as a thermal siphon.

10. The method of claim 1, further comprising:
    reducing a pressure of the fluid coolant to a subambient pressure such that the fluid coolant has a boiling temperature less than a temperature of the heat-generating structure.

11. A method for cooling a heat-generating structure, the method comprising:
    transferring thermal energy from the heat-generating structure to a plurality of pin fins disposed in a chamber, the plurality of pin fins including upstream pin fins and downstream pin fins, the pin fins arranged in a pattern with a first portion of the pin fins having a first shape and a second portion of the pin fins having a second shape, the second portion of the pin fins arranged along two sides of the pattern and in a row within the pattern;
    introducing a fluid coolant into the chamber;
    exposing the fluid coolant to the upstream pin fins disposed in the chamber, thereby causing a portion of the fluid coolant substantially in liquid form to boil and effuse vapor during a transfer of the thermal energy from the upstream pin fins to the fluid coolant, the effused vapor creating a self-induced flow in the chamber and creating a jet impingement of fluid coolant upon at least a portion of the plurality of pin fins;
    distributing the fluid coolant substantially in the liquid form to the downstream pin fins through a spraying effect energized by the self-induced flow; and
    transferring at least a portion of the thermal energy from the downstream fins to the sprayed fluid coolant.

12. The method of claim 11, further comprising:
    creating a maximum temperature differential between the plurality of pin fins disposed in the chamber to less than two degrees Celsius.

13. The method of claim 11, wherein a flow of the fluid coolant into the chamber is gravity fed.

14. The method of claim 11, further comprising:
    operating the chamber and the pin fins as a thermal siphon.

15. The method of claim 11, wherein the self-induced flow is chaotic.

16. The method of claim 11, further comprising:
    reducing a pressure of the fluid coolant to a subambient pressure such that the fluid coolant has a boiling temperature less than a temperature of the heat-generating structure.

17. The method of claim 11, wherein the chamber comprises a chamber in a coldplate.

18. The method of claim 11, wherein the pin fins are made of nickel plated copper and vary in size from 0.04 inches high to 0.1675 inches high.

19. The method of claim 1, wherein the pin fins are made of nickel plated copper and vary in size from 0.04 inches high to 0.1675 inches high.

* * * * *